(12) United States Patent
Fricker et al.

(10) Patent No.: US 9,781,858 B2
(45) Date of Patent: Oct. 3, 2017

(54) APPARATUS TO FACILITATE ORTHOGONAL COUPLING OF A SERVER SLED WITH A SERVER BACKPLANE

(71) Applicant: Advanced Micro Devices, Inc., Sunnyvale, CA (US)

(72) Inventors: Jean-Philippe Fricker, Mountain View, CA (US); Donald C. Lewis, Richmond, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 51 days.

(21) Appl. No.: 14/523,645

(22) Filed: Oct. 24, 2014

(65) Prior Publication Data
US 2015/0334868 A1 Nov. 19, 2015

(51) Int. Cl.
*H05K 7/00* (2006.01)
*H05K 7/14* (2006.01)
*H05K 7/18* (2006.01)

(52) U.S. Cl.
CPC ............ *H05K 7/1489* (2013.01); *H05K 7/18* (2013.01)

(58) Field of Classification Search
None
See application file for complete search history.

(56) References Cited

U.S. PATENT DOCUMENTS

| 5,325,269 A * | 6/1994 | Someno ................. G06F 1/184 361/785 |
| 7,679,933 B2 * | 3/2010 | Makabe ................. G06F 1/185 174/365 |
| 8,755,191 B2 * | 6/2014 | Riebel ................. H05K 7/1488 361/679.38 |
| 8,934,244 B2 * | 1/2015 | Shelnutt ............ H05K 7/20254 312/223.1 |
| 9,398,720 B1 * | 7/2016 | Frank ................. H05K 7/20136 |
| 9,454,192 B2 * | 9/2016 | Farrow ................... G06F 1/181 |
| 2003/0031002 A1 * | 2/2003 | Siira .................... H05K 7/1454 361/796 |
| 2004/0100762 A1 * | 5/2004 | Yuan ....................... G06F 1/184 361/679.39 |
| 2004/0228634 A1 * | 11/2004 | Fricker ................ G02B 6/4453 398/135 |
| 2005/0243507 A1 * | 11/2005 | Lambert ................. G06F 1/187 361/679.39 |
| 2007/0035933 A1 * | 2/2007 | Chuang ................ H05K 7/1492 361/752 |
| 2007/0091559 A1 * | 4/2007 | Malone .................. G06F 1/187 361/679.32 |
| 2007/0140787 A1 * | 6/2007 | Champion ............. G06F 1/183 403/321 |

(Continued)

*Primary Examiner* — Courtney Smith
*Assistant Examiner* — Rashen E Morrison (57) ABSTRACT

An orthogonal coupling mechanism includes a threaded rod, a pair of travelers engaging the threaded rod, and an actuator. The actuator is disposed on the threaded rod, such that the actuator translates a first axial force along the axis of the threaded rod into a rotational movement of the threaded rod about its axis. The rotational movement created by the actuator causes the pair of travelers to travel along the axis of the threaded rod, moving a sliding board into engagement with a first connector in a direction orthogonal to a direction of the first axial force.

22 Claims, 7 Drawing Sheets

(56) References Cited

U.S. PATENT DOCUMENTS

| | | | |
|---|---|---|---|
| 2007/0201210 A1* | 8/2007 | Chow | H05K 7/20727 361/704 |
| 2009/0097200 A1* | 4/2009 | Sharma | G06F 1/18 361/688 |
| 2009/0161312 A1* | 6/2009 | Spearing | H05K 7/20727 361/679.47 |
| 2010/0321874 A1* | 12/2010 | Bhattacharyya | H05K 7/20736 361/679.5 |
| 2012/0048685 A1* | 3/2012 | Chen | B65G 25/02 198/750.1 |
| 2012/0050986 A1* | 3/2012 | Riebel | H05K 7/1488 361/679.48 |
| 2012/0075815 A1* | 3/2012 | Fuke | H05K 7/1409 361/756 |
| 2012/0108093 A1* | 5/2012 | Sato | H01R 13/62994 439/160 |
| 2012/0113581 A1* | 5/2012 | Anguiano-Wehde | G06F 1/187 361/679.33 |
| 2015/0195943 A1* | 7/2015 | Fricker | H05K 7/1409 361/679.58 |

\* cited by examiner

FIG. 4
(VIEW 4-4)

APPARATUS TO FACILITATE ORTHOGONAL COUPLING OF A SERVER SLED WITH A SERVER BACKPLANE

BACKGROUND

Field of the Disclosure

The present disclosure relates generally to the coupling of a server sled with a server backplane and, more particularly, to the coupling of a server sled and a server backplane having orthogonal connectors.

Description of the Related Art

Conventional server chassis are designed so that server sleds (also commonly called server blades) are connected to a backplane or other server interconnect via connectors disposed in-line with the direction of insertion of the server sled into the server chassis. With this arrangement, the technician installing the server sled may apply force in a single direction to both insert the sled into the server chassis and couple the sled to the server chassis connector at the back of the server chassis and in line with the direction of the insertion force. However, the technician generally pushes the sled from an edge furthest away from the connecting backplane, forcing the sled toward the server backplane and introducing unstable compression forces along the length of the sled, which can cause it to bend or crack. Further, in many implementations, the technician building, maintaining, or modifying the computing system does not have a clear view of the connector on the backplane during the sled coupling process, and thus is required to attempt to couple the connector on the sled with the corresponding connector at the backplane without visual cues. This frequently leads to misalignment resulting in damage to the connectors or the sleds themselves.

In some implementations, it may be advantageous to position the sled-chassis connectors orthogonal to the direction of insertion of the sled, such that the technician installing the sled must first apply a force in one direction to insert the sled into the server chassis, and then apply a second force in an orthogonal direction to couple the sled with the server chassis connector. This orthogonal arrangement shares similar characteristics with the arrangement described above; for example, the technician must couple the connectors without visual cues which often leads to misalignment, and the axial force applied by the technician can introduce unstable compression forces along the length of the sled. Further, in many implementations, the connector is disposed at a major edge of the sled while the orthogonal force is applied to a minor edge of the sled, reducing the technician's control over the sled and increasing the likelihood of a misalignment of the connectors, which can result in a failure to electrically and mechanically couple the connectors, or even damage one or both of the connectors.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-7 illustrate example implementations of an orthogonal coupling mechanism to facilitate coupling of a connector of an inserting sliding board with a corresponding connector of a chassis when the coupling direction of the connectors is orthogonal to the direction of insertion of the sliding board into the chassis. For example, the orthogonal coupling mechanism could be used to facilitate coupling of a server blade, server sled, printed circuit board (PCB), or other sliding board with a server backplane, motherboard, PCB, or other circuit board. In the illustrated embodiments, the sliding board having the connector is at least partially enclosed by an enclosure that allows the sliding board to slide within the enclosure in a lateral direction relative to the connection surface of the corresponding connector. The orthogonal coupling mechanism is illustrated as comprising a threaded rod, a pair of travelers, a carrier, and an actuator. The orthogonal coupling mechanism is coupled to the sliding board via the carrier which is also coupled to the pair of travelers. The travelers and the actuator are disposed on the threaded rod, and the actuator further serves as a handle, such that a technician or other user may apply an axial force to the actuator to insert the sliding board into a server chassis or other receiving slot.

The mounting chassis or other receiving slot is fitted with a rail to receive the orthogonal coupling mechanism. For example, in the illustrated embodiments, the travelers are coupleable to the rail such that the travelers can slide along the length of the rail. The rail further comprises a lip that extends along a portion of the length of the rail, to prevent the carrier from moving toward the rail. As long as the lip of the rail is in contact with the carrier, preventing the carrier from moving toward the rail, an axial force applied to the actuator will result in the orthogonal coupling mechanism and the sliding board moving in the direction of the axial force. However, when the lip of the rail no longer prevents the carrier from moving toward the rail, the actuator translates the axial force along the axis of the threaded rod into a rotational movement about the axis of the threaded rod. The threads of the threaded rod are such that the rotation of the threaded rod caused by the actuator results in each traveler of the pair of travelers traveling along the threaded rod in opposite directions relative to each other. As the travelers move in opposite directions, each of the travelers slides along a ridge of the carrier from a distance further from the rail to a distance closer to the rail, causing the carrier to move toward the rail, and thereby pulling the sliding board and its connector toward the corresponding connector, completing the coupling of the connectors.

In a practical application of the orthogonal coupling mechanism involving a connector of a server sled and a corresponding connector at a server chassis, a technician applies an axial force on the actuator in the direction of insertion of the server sled into the server chassis. The axial force causes the orthogonal coupling mechanism and the server sled to move in the direction of insertion as the travelers slide along the rail. Once the server sled is inserted into the server chassis, the axial force applied by the technician is translated to a rotational movement, such that threaded rod rotates, causing the travelers and carrier to move such that they pull the connector of the server sled in a direction orthogonal to the axial force, coupling the connector of the server sled with the corresponding connector.

Note that although the structures and techniques described herein are described in the example context of coupling a circuit board of a server sled to a corresponding connector in a server chassis, the disclosed techniques can be used in a variety of contexts (e.g. expansion cards). For example, components described as a "circuit board" in the illustrated embodiments may be any type of sliding board in other embodiments, for example a PCB, a stripboard, a substrate board and the like. Similarly, in the illustrated embodiments, components described as a "server chassis" may be any type of mounting chassis or slot comprising any type of corresponding connector in other embodiments, for example the slot may comprise a PCB, a stripboard, a motherboard, a server backplane, and the like.

Figure 1:
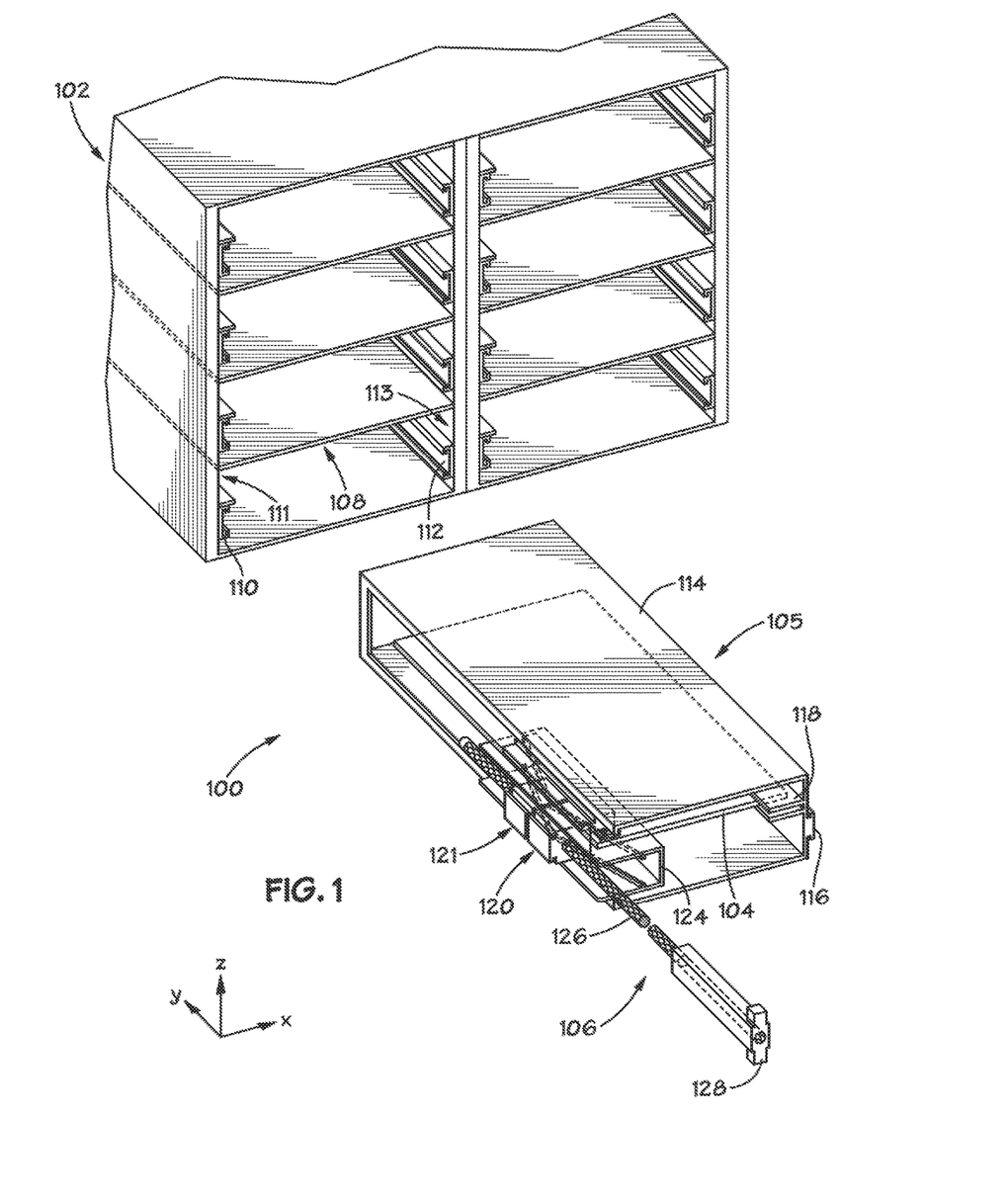
FIG. 1 is a perspective view of a server having a server chassis, a sled, and an orthogonal coupling mechanism in accordance with some embodiments.

FIG. 1 illustrates a server 100 having a server chassis 102, a circuit board 104, and an orthogonal coupling mechanism 106 configured to couple the circuit board 104 to the server chassis 102 via corresponding connectors that couple in a direction (x-direction) orthogonal to the direction of insertion (y-direction) of the circuit board 104 into the server chassis 102 in accordance with some embodiments. In some embodiments, the server chassis 102 comprises a plurality of slots, such as slot 108, to receive a corresponding server sled. In at least one embodiment, each slot 108 comprises a backplane connector extending from an internal side surface of the slot 108 in a direction (x-direction) orthogonal to the direction of insertion of the circuit board 104. The backplane connector may comprise any connector corresponding to the connector of the circuit board 104, for example, a peripheral component interconnect express (PCIe) card edge connector, a serial advanced technology attachment (SATA), a serial attached small computer system interface (SAS), or the like. Conventionally, the orientation of the backplane connector requires a technician to first apply a force in the y-direction to insert the circuit board 104 into the slot 108, then apply a force in the x-direction (orthogonal to the direction of insertion) to couple the connector of the circuit board 104 with the corresponding backplane connector. Due to limited visibility and accessibility or any lever that applies a transversal force in the y-direction, the technician may fail to couple the connectors or may even damage one or both of the connectors. In contrast, the coupling mechanism 106 allows a technician or other user to apply a force in the y-direction to couple the connector of the circuit board 104 with the corresponding backplane connector.

In the illustrated embodiment, a rail 110 is disposed at an interior surface 111 of the slot 108 of the server chassis 102 to receive and guide the insertion of the orthogonal coupling mechanism 106 into the slot 108 in the y-direction. A second rail 112 is disposed at an opposing interior surface 113 of the slot 108 of the server chassis 102. The second rail 112 is to further guide the circuit board 104, or an enclosure 114 slidably coupled to the circuit board 104, during insertion into the slot 108 of the server chassis 102 in the y-direction. For example, in the illustrated embodiment, the enclosure 114 comprises a tab 116 configured to couple with the second rail 112, such that when the tab 116 is inserted into the second rail 112, the second rail 112 maintains its connection with the tab 116 while allowing the enclosure 114 to slide in the y-direction. The enclosure 114 at least partially encloses the circuit board 104 and includes a guide 118 at an interior surface of the enclosure 114 to facilitate sliding of the circuit board 104 along the y-axis. Together, the circuit board 104 and the enclosure 114 represent a server sled 105. Some embodiments do not include an enclosure 114; in these embodiments, the second rail 112 may receive and guide the circuit board 104. Further, in some embodiments, the slot 108 or the orthogonal coupling mechanism alone guides the enclosure 114, such that a second rail 112 is not included.

The orthogonal coupling mechanism 106 is configured to interface with the rail 110 and the circuit board 104 to facilitate a guided insertion of the sled into the slot 108 of the server chassis 102. In the illustrated embodiment, a pair of travelers 120, 121 facilitate coupling of the orthogonal coupling mechanism 106 to the rail 110 via tabs configured to engage the rail 110 such that the travelers 120, 121 may slide along the rail 110 in the y-direction. Further, each of the travelers 120, 121 comprises angled grooves on opposing surfaces configured to engage corresponding angled ridges on opposing surfaces of a carrier 124, such that the travelers 120, 121 are slidably coupled to the carrier 124. The carrier 124 is further coupled to the circuit board 104, such that the travelers 120, 121 may facilitate movement of the circuit board 104 in the x-direction, via the carrier 124. The carrier 124 may be coupled to the circuit board 104 using any of a variety of fastening components, for example, machine fastening component, bolt, pin, solder, glue, and the like. Further, in different embodiments, the carrier 124 may be coupled to the circuit board 104 in any of a variety of arrangements other than the arrangement depicted in FIG. 1.

The orthogonal coupling mechanism 106 further comprises a threaded rod 126 and an actuator 128. In some embodiments, the enclosure 114 is coupled to the threaded rod 126, such that the enclosure 114 does not engage the threads of the threaded rod 126 and does not rotate when the actuator 128 causes the threaded rod 126 to rotate about its axis. Further, the connection between the enclosure 114 and the threaded rod 126, stabilizes the enclosure 114 and facilitates keeping the axis in place, while allowing the threaded rod 126 to rotate about its axis.

In at least one embodiment, the actuator 128 facilitates both insertion of the circuit board 104 into the slot 108 of the server chassis 102 in the y-direction, and translation of a force in the y-direction to rotational movement about the axis of the threaded rod 126 to pull the sliding board in the x-direction so as to couple an electrical connector of the circuit board 104 with the backplane connector of the slot 108. The travelers 120, 121 are disposed on the threaded rod with each traveler 120, 121 threaded to correspond with a thread of the threaded rod 126, such that when the actuator 128 causes the threaded rod 126 to rotate about its axis, the travelers 120, 121 travel along their respective threads. In the illustrated embodiment, traveler 120 is counter-threaded relative to traveler 121, such that when the actuator 128 causes the threaded rod 126 to rotate, the travelers 120, 121 travel along separate threads of the threaded rod 126 in opposite directions relative to each other, allowing each traveler 120, 121 to slide along its corresponding portions of the angled ridges of the carrier 124, thereby pulling the circuit board 104 in the x-direction. The operation of the travelers 120, 121 is described in greater detail below with reference to FIGS. 2A-7.

In at least one embodiment, the threaded rod 126 comprises three sets of threads, with two threads of equal pitch in opposite directions around the shaft of the rod 126 corresponding to the travelers 120, 121, and a third thread of a different pitch corresponding to the actuator 128. In at least one embodiment, the two threads of equal pitch in opposite directions do not overlap, such that the first thread is disposed at a first portion of the threaded rod 126 while the second thread is disposed at a second portion of the threaded rod 126. In other embodiments, the rod 126 may comprise more threads, less threads, threads of different pitches, threads in different directions, and the like. In at least one embodiments, all three threads are of the same pitch.

Figure 2A:
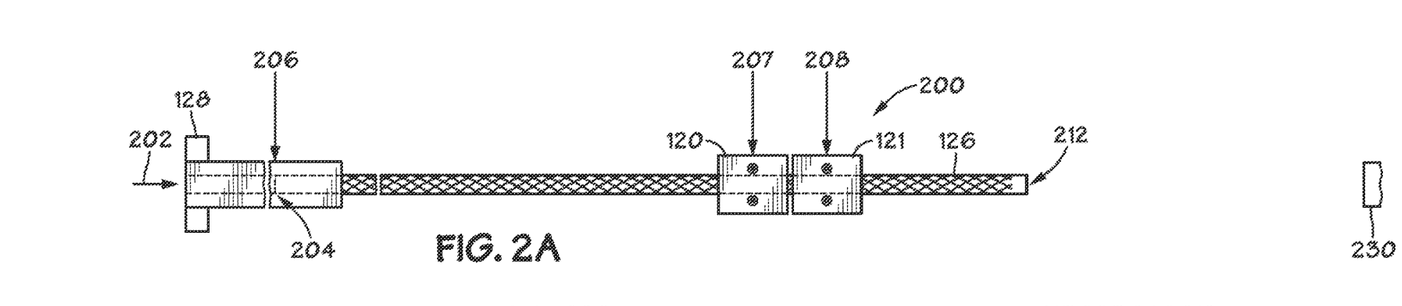
FIGS. 2A, 2B, and 2C are side views of a threaded rod assembly of the orthogonal coupling mechanism of FIG. 1 in accordance with some embodiments.
Figures 2B, 2C:
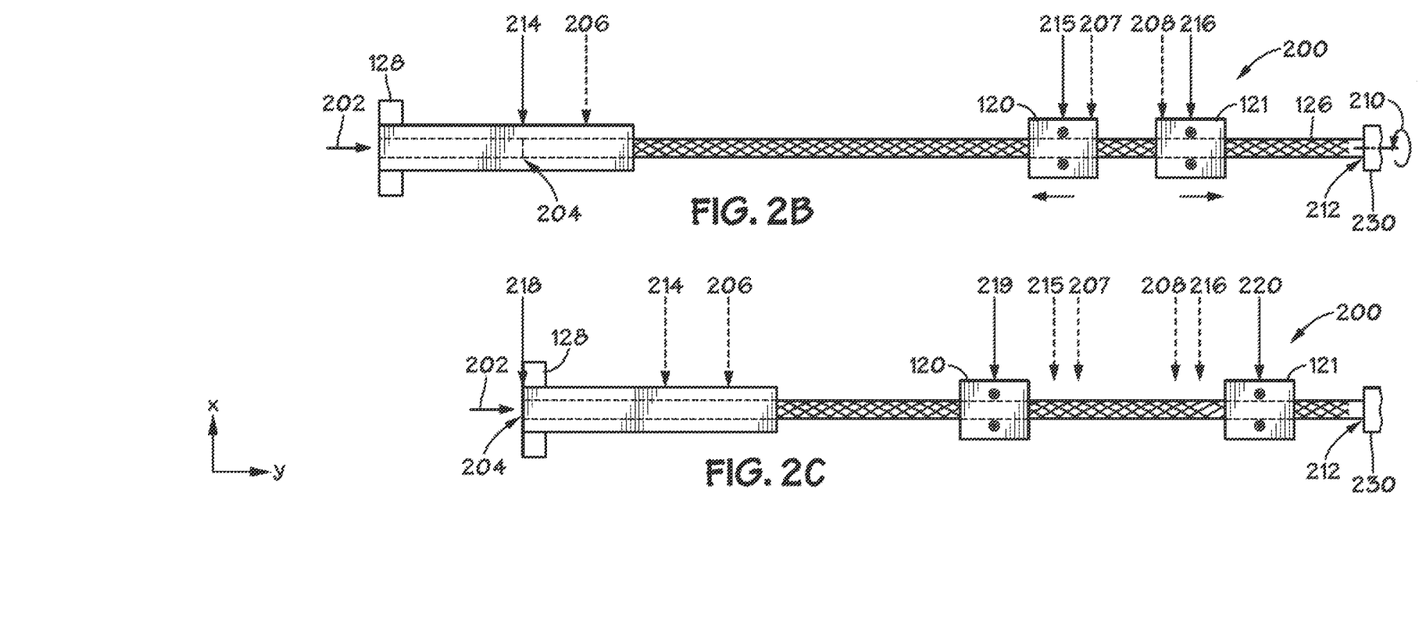

FIGS. 2A-2C illustrate side views of a threaded rod assembly 200 of the orthogonal coupling mechanism 106 of FIG. 1 depicting different stages of the operation of the threaded rod assembly 200 in response to an axial force 202 applied to the actuator 128 in accordance with some embodiments. FIG. 2A illustrates the threaded rod assembly 200 during insertion of the circuit board 104 as a result of the axial force 202 in the y-direction applied to the actuator 128, but before the actuator 128 has translated the axial force 202 into a rotational movement about the axis of the threaded rod 126. At this point, a proximal end 204 of the threaded rod 126 is at a first position 206, and the travelers 120, 121 are at first positions 207 and 208, respectively. At this stage, lateral travel of the threaded rod assembly 200 is unimpeded in the direction of the axial force 202, the proximal end 204 of the threaded rod 126 will remain in this first position 206 relative to the actuator 128, and the travelers 120, 121 will remain in these first positions 207, 208 relative to the threaded rod 126, while the threaded rod assembly 200 as a whole (and therefore the circuit board 104) moves in the y-direction in response to the axial force 202.

FIG. 2B illustrates the threaded rod assembly 200 after the circuit board 104 has moved in the direction of the axial force 202, and after the actuator 128 has begun to translate the axial force 202 into rotational movement 210 about the axis of the threaded rod 126. For example, in at least one embodiment, the actuator 128 translates the axial force 202 into a rotational force to cause rotational movement 210 of the threaded rod 126 about its axis. In some embodiment, the axial force 202 may result in movement in the y-direction and rotation (illustrated in FIGS. 2B and 2C as a counter-clockwise rotation, but may be a clockwise rotation in other embodiments) about the axis of the threaded rod 126 simultaneously, until a stopper 230 or other impediment prevents further movement in the y-direction while allowing rotation about the axis of the threaded rod 126. In other embodiments, the actuator 128 does not translate the axial force 202 into the rotational movement 210 until after the threaded rod assembly 200 has ceased movement in the y-direction due to the stopper 230, or otherwise. The stopper 230 may comprise any of a variety of mechanisms capable of stopping the threaded rod assembly 200 from moving in the y-direction while still allowing rotation about the axis of the threaded rod 126. For example, the stopper 230 in at least one embodiment is disposed at the rail 110 or a wall of the slot 108 of the server chassis 102 to catch a distal end 212 of the threaded rod 126, or otherwise prevent the threaded rod 126 from proceeding further in the y-direction.

The interior of the actuator 128 is threaded to correspond to a thread of the threaded rod 126, such that the actuator can travel along the corresponding thread of the threaded rod 126. At the stage of operation illustrated in FIG. 2B, the axial force 202 pushes the actuator 128 in the y-direction, while preventing the actuator 128 from rotating about the axis of the threaded rod 126, resulting in the actuator 128 causing the threaded rod 126 to rotate about its axis due its corresponding thread, thereby translating the axial force 202 into the rotational movement 210. As the threaded rod 126 rotates about its axis, the travelers 120, 121 are forced to travel along their respective threads. In the illustrated embodiment, traveler 120 is counter-threaded relative to traveler 121, such that traveler 120 travels along a separate thread of the threaded rod 126 relative to traveler 121, and in the opposite direction along the z-axis relative to traveler 121. At this point, travelers 120, 121 have traveled in opposite direction to second positions 215 and 216 respectively, and the actuator 128 has traveled such that the proximal end 204 of the threaded rod 126 is now at a second position 214. As illustrated, the threads of each traveler 120, 121 are of equal pitch, such that the travelers 120, 121 travel the same distance in opposite directions. However, the thread of the actuator 128 is of a greater pitch than the threads of each traveler 120, 121, such that the actuator 128 travels a greater distance than each traveler 120, 121. For example, in at least one embodiment the thread of the threaded rod 126 corresponding to the actuator 128 has a pitch twice as long as the threads corresponding to the travelers 120, 121, such that the actuator 128 travels (in the y-direction) a distance twice the distance traveled by each traveler 120, 121.

FIG. 2C illustrates the threaded rod assembly 200 after it has completed movement in response to the axial force 202, including both y-direction movement and rotational movement about the axis of the threaded rod 126. For example, in the context of the server 100, at this point the axial force 202 has caused the circuit board 104 to be inserted in the slot 108 of the server chassis 102, and due to the actuator 128 translating the axial force 202 into the rotational movement 210, moved the circuit board 104 in the x-direction coupling the corresponding connectors. The mechanisms used to translate the rotational movement 210 into the movement of the circuit board 104 in the x-direction and the coupling of the corresponding connectors is described in greater detail below with reference to FIGS. 5A-6B.

As illustrated, due to the difference in thread pitch, the actuator 128 has traveled a greater distance than either traveler 120, 121, as indicated by a final position 218 of the proximal end 204 of the threaded rod 126 relative to its first position 206 and final positions 219, 220 of the travelers 120, 121 relative to their respective first positions 207, 208. In the illustrated embodiment, the proximal end 204 of the threaded rod 126 prevents the actuator 128 from proceeding to travel along the corresponding thread of the threaded rod 126, thereby preventing the actuator 128 from translating the axial force 202 into the rotational movement 210, as it did in FIG. 2B. Further, the stopper 230 continues to prevent the axial force 202 from causing movement in the y-direction. As a result, the axial force 202 results in no movement of the threaded rod assembly 200 in the x-direction or the y-direction However, a force in the opposite direction of the axial force 202 (such that the actuator 128 would be pulled instead of pushed) would result in the reverse of the operation depicted in FIGS. 2A-2C. That is, the actuator 128 would travel along its corresponding thread away from the proximal end 204 of the threaded rod 126, translating the pulling force into a rotational movement in the opposite direction of rotational movement 210, and causing the travelers 120, 121 to travel toward each other. In the context of the server 100, the corresponding connectors would be decoupled as the circuit board 104 is moved in the opposite x-direction away from the corresponding connector. When the travelers 120, 121 have reached their first positions 207, 208, or the actuator 128 has no further to travel along its thread away from the proximal end 204 of the threaded rod 126, the actuator 128 will cease to translate the pulling force into the opposite rotational movement. The pulling force will pull the threaded rod assembly 200 in the opposite y-direction, and in the context of the server 100, remove the circuit board 104 from the slot 108 of the server chassis 102.

Figure 3A:
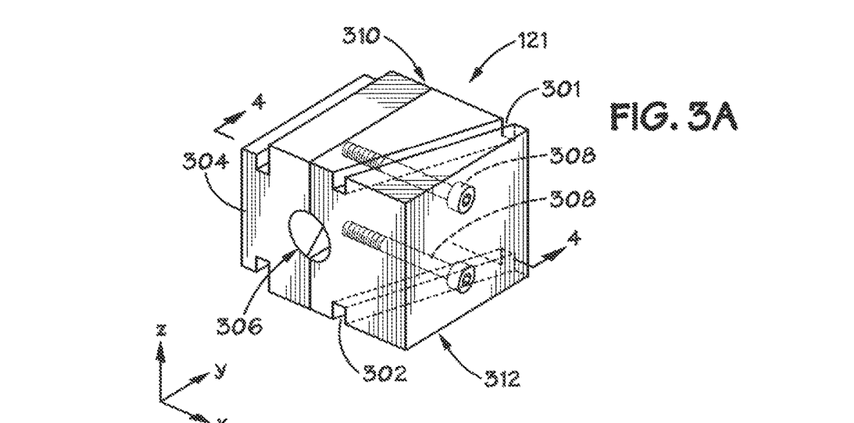
FIGS. 3A and 3B are a perspective view and a side view, respectively, of a traveler of the threaded rod assembly of FIG. 2 in accordance with some embodiments.
Figure 3B:
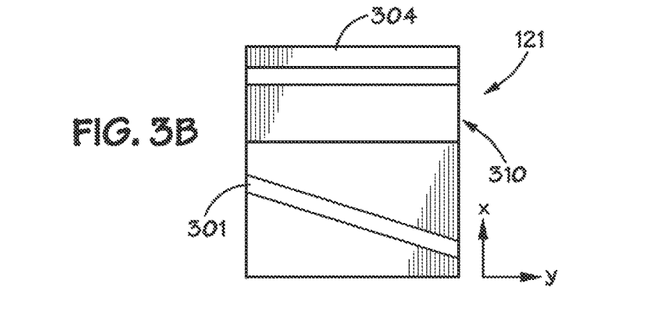

FIGS. 3A and 3B illustrate a perspective view and a side view, respectively, of one traveler 121 of the pair of travelers 120, 121 of the threaded rod assembly 200 of FIGS. 2A-2C of the orthogonal coupling mechanism 106 of FIG. 1 in accordance with some embodiments. As illustrated in FIG. 3A, the traveler 121 comprises angled grooves 301, 302, tab 304, threaded hole 306, and fastening components 308. The tab 304, which is also illustrated in the side view of FIG. 3B, is configured to correspond to the rail 110, such that the tab 304 of the traveler 121 can be coupled to the rail 110 while allowing the traveler 121 to slide along the rail 110 in the y-direction, to facilitate insertion in the negative x direction of the circuit board 104 into the slot 108 of the server chassis 102. In some embodiments, the traveler 121 comprises one or more grooves to engage one or more edges of the rail 110 instead of, as part of, or in addition to the tab 304. Angled groove 301 is disposed at a top surface 310 of the traveler 121, while angled groove 302 is disposed at a bottom surface 312 of the traveler 121. The angled grooves 301, 302 are configured to receive corresponding angled ridges of the carrier 124, such that the traveler 121 may slide along the corresponding angled ridges to move the carrier 124 in the x-direction, thereby moving the circuit board 104 in the x-direction. Angled groove 301 at the top surface 310 of the traveler 121 is also illustrated in the side view of FIG. 3B. Other embodiments may employ different groove-and-ridge structures, for example, the traveler 121 may comprise one or more angled ridges, the carrier 124 may comprise one or more grooves, the carrier 124 may comprise one or more slots, the traveler 121 may comprise one or more pins, and the like.

The threaded hole 306 corresponds to a thread of the threaded rod 126, such that the traveler 121 may travel along the corresponding thread of the threaded rod 126. In at least one embodiment, the traveler 121 is assembled on the threaded rod 126, such that the traveler 121 is divided at the threaded hole 306 into separate parts, and then assembled over the threaded rod 126. Traveler 121 is depicted with cutline 4-4, the cross-section of which is described in detail below with reference to the cross-section view of FIG. 4, which also illustrates the assembly of the traveler 121 in accordance with one embodiment. Various embodiments differ in which components comprise a protrusive thread and which components comprise a grooved thread. For example, in at least one embodiment, the threads of the helical rod 126 comprise helical protrusions, while the threads of the travelers 120, 121 and the actuator 128 comprise helical grooves.

Figure 4:
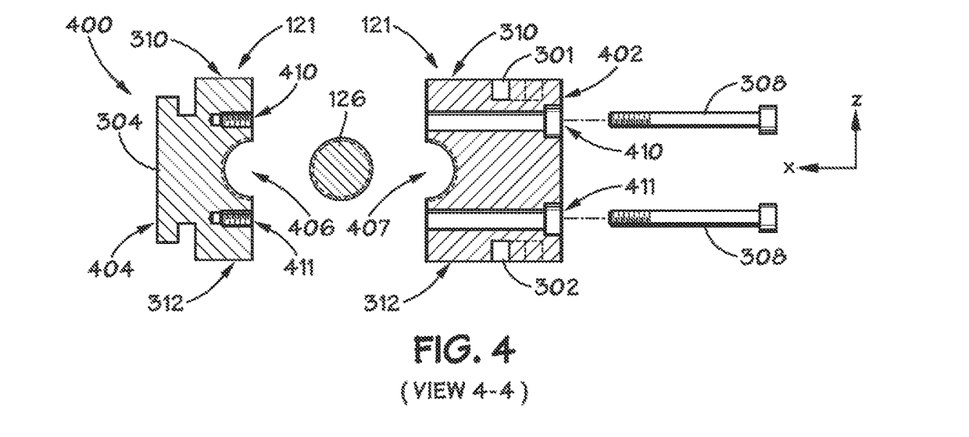
FIG. 4 is an exploded cross-section view along a cutline of the traveler of FIG. 3A and a threaded rod of the threaded rod assembly of FIGS. 2A-2C of the orthogonal coupling mechanism of FIG. 1 in accordance with some embodiments.

FIG. 4 is an exploded cross-section view along cutline 4-4 of the traveler 121 of FIG. 3A and the threaded rod 126 of the threaded rod assembly 200 of FIGS. 2A-2C of the orthogonal coupling mechanism 106 of FIG. 1, illustrating a traveler assembly 400 in accordance with some embodiments. The traveler 121 is divided into a carrier portion 402 and a rail portion 404, such that the carrier portion 402 couples to the carrier 124, and the rail portion 404 couples to the rail 110. The carrier portion 402 comprises helical threaded semicircular cutout 406, and the rail portion 404 comprises helical threaded semicircular cutout 407, such that when the traveler 121 is assembled, the helical threaded semicircular cutouts 406, 407 form the threaded hole 306 about the threaded rod 126. Holes 410, 411 extend through the carrier portion 402 into the rail portion 404 such when the carrier portion 402 and the rail portion 404 are brought together around the threaded rod 126, the fastening components 308 may be inserted into the holes 410, 411 to couple the carrier portion 402 and the rail portion 404, thereby assembly the traveler 121 on the threaded rod 126. The fastening components 308 each may comprise, for example, a screw, a pin, a bolt, a clip, adhesive, a combination of these, and the like. In other embodiments, different portions of the traveler 121 may be used, for example the traveler 121 may be divided into more than two portions. Further, in some embodiments the traveler 121 may be threaded onto the threaded rod 126 from the tip of the threaded rod 126, rather than assembled around the threaded rod 126.

Figure 5A:
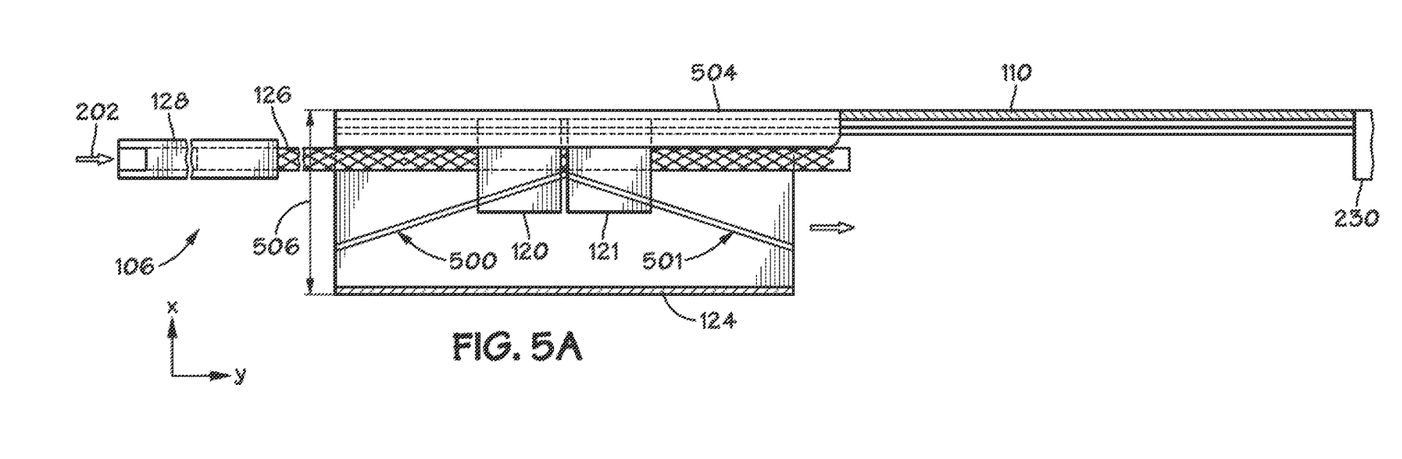
FIGS. 5A, 5B, 5C, and 5D are side views of the orthogonal coupling mechanism of FIG. 1 in accordance with some embodiments.

FIGS. 5A-5D are side views of the orthogonal coupling mechanism 106 of FIG. 1 illustrating the operation of the orthogonal coupling mechanism 106 to insert the circuit board 104 into the slot 108 of the server chassis 102 and couple corresponding connectors in a direction (x-direction) orthogonal to the direction of insertion (y-direction) in accordance with some embodiments. FIG. 5A illustrates rail 110 coupled to the orthogonal coupling mechanism 106 via the travelers 120, 121 as described above with reference to FIG. 3A. The travelers 120, 121 are in a first position at a section of their respective angled ridges 500, 501 closer to the rail 110. At this position, the axial force 202 moves the orthogonal coupling mechanism 106 in the y-direction, inserting the orthogonal coupling mechanism into the slot 108 of the server chassis 102. While the view of FIG. 5A illustrates the angled ridges 500, 501 coupled with one surface of the travelers 120, 121, in at least one embodiment, the angled ridges 500, 501 are disposed at opposing interior surfaces of the carrier 124, such that they couple with opposing surfaces of the travelers 120, 121.

In the illustrated position of the orthogonal coupling mechanism 106, the actuator 128 is prevented from translating the axial force 202 into a rotational movement by a lip 504 of the rail 110. The lip 504 is dimensioned to abut the carrier 124, such that height 506 represents the combined height of the lip 504 and the carrier 124, and such that the lip 504 prevents the carrier 124 from moving in the x-direction toward the rail 110 when the carrier 124 is in contact with the lip 504. Since the travelers 120, 121 cannot travel along their respective counter-threads of the threaded rod 126 without sliding along the angled ridges 500, 501, and thereby pulling the carrier 124 in the x-direction toward the rail, the lip 504 also prevents the travelers 120, 121 from travelling by preventing the carrier 124 from moving in the x-direction toward the rail 110. Further, the actuator 128 cannot overcome the counterforce created by the travelers 120, 121, and as a result, the axial force 202 results in the movement of the orthogonal coupling mechanism 106 in the x-direction only. The lip 504 extends along a section of the length of the rail 110 that is less than the total length of the rail 110, such that when the carrier 124 has passed the section of the rail 110 comprising the lip 504, the counterforce of the travelers 120, 121 is diminished, and the actuator 128 is no longer prevented from translating the axial force 202 into a rotational movement.

Figure 5B:
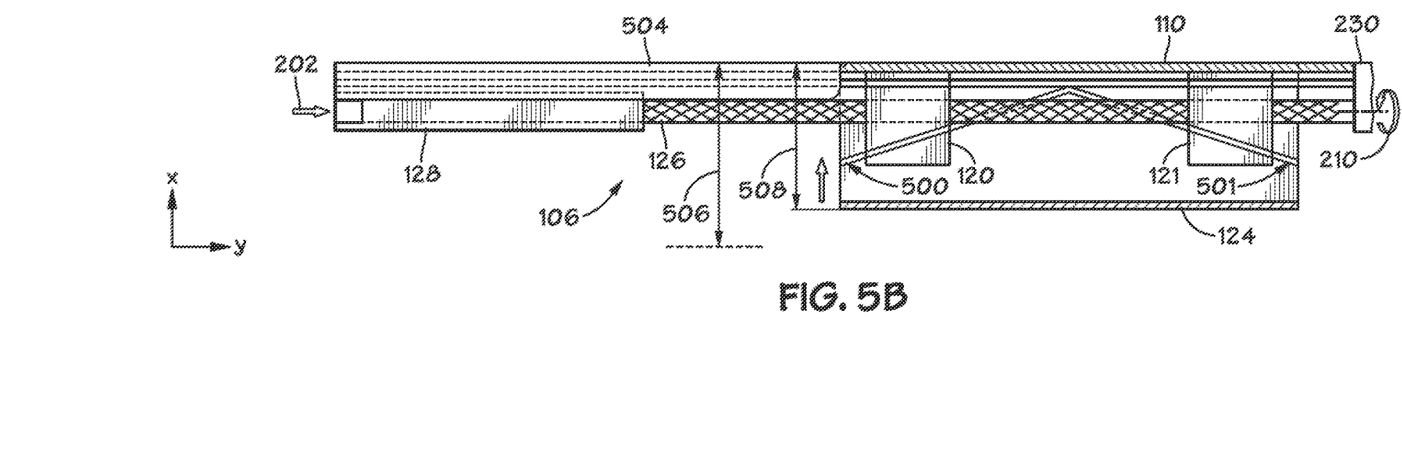

FIG. 5B illustrates the orthogonal coupling mechanism 106 after the carrier 124 has passed the lip 504, such that the lip 504 no longer prevents the carrier 124 from moving in the x-direction toward the rail 110, and thereby the travelers 120, 121 from traveling along their respective threads of the threaded rod 126. Since the travelers 120, 121 are no longer prevented from moving, the actuator 128 can overcome their counterforce to translate the axial force 202 into rotational movement 210. The actuator 128 causes the threaded rod 126 to rotate, causing the travelers 120, 121 to travel along their respective counter-threads in opposite directions, sliding along their respective angled ridges 500, 501 of the carrier 124 from a section of each angled ridge 500, 501 closer to the rail 110 to a section of each angled ridge 500, 501 further from the rail. As the travelers 120, 121 travel to the section of the angled ridges 500, 501 further from the rail 110, the carrier 124 is pulled in the x-direction, closer to the rail, such that height 508 represents the height of the carrier 124 less the height of the lip 504.

As discussed above with reference to FIGS. 2A-2C, in at least one embodiment, the pitch of the thread on the threaded rod 126 engaged by the actuator 128 is greater than the pitch of each thread on the threaded rod 126 engaged by each traveler 120, 121, such that the orthogonal coupling mechanism 106 acts as a force multiplier. That is, the actuator 128 travels a greater distance than each of the travelers 120, 121 as a result of the axial force 202, and therefore, the axial force 202 applied to the actuator 128 is less than the resulting pulling force on the carrier 124 by the travelers 120, 121. The force multiplier effect may be controlled based on the angle of the angled ridges of the carrier 124. For example, in at least one embodiment, the angle of the angled ridge 501 compared to the y-axis defines how much a given displacement of traveler 121 displaces the carrier 124 in the x-direction. For example, in some embodiments, a 45 degree angle creates a 1:1 displacement, and a 15 degree angle creates a displacement of tan(15):1 (i.e., the force moving the carrier 124 in the x-direction toward the backplane connector would be 1/tan(15) bigger than the force moving the traveler 121 in the y-direction (assuming no friction)).

Figure 5C:
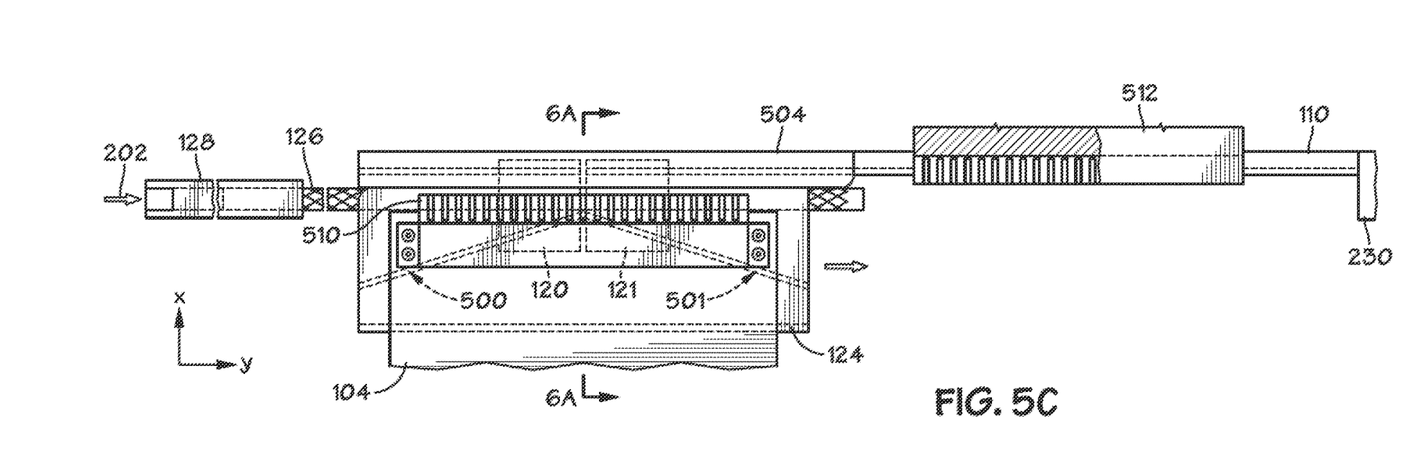
Figure 5D:
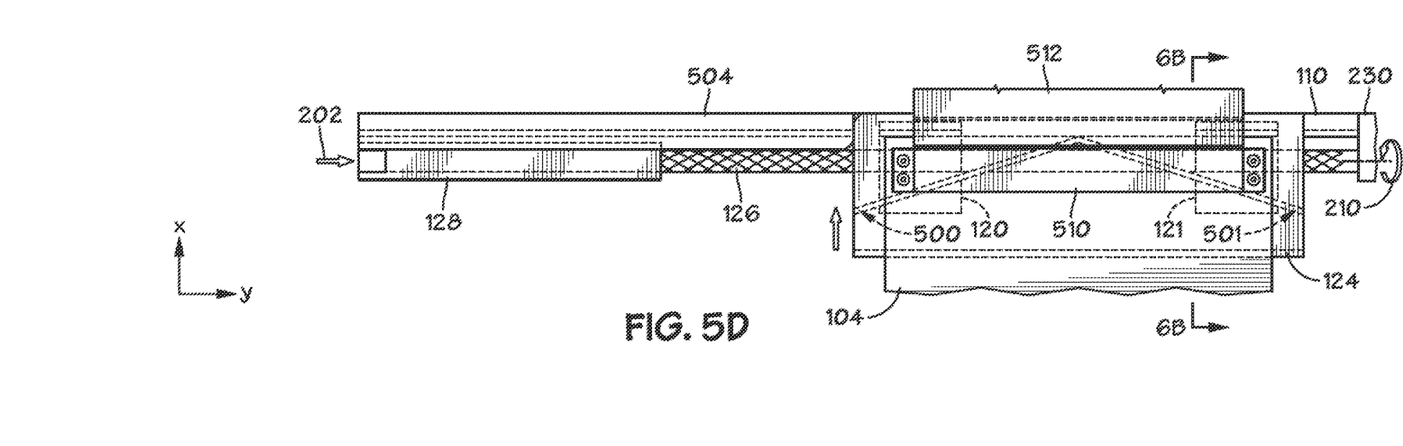

FIGS. 5C and 5D represent the orthogonal connecting mechanism 106 of FIGS. 5A and 5B, with the addition of the circuit board 104, a circuit board connector 510 coupled to the circuit board 104, and a corresponding connector 512 coupled to the server chassis 102. In the illustrated embodiment, the lip 504 prevents the carrier 124 from moving the circuit board 104 in the x-direction toward the rail 110 until the circuit board connector 510 is aligned with the corresponding connector 512 to prevent damage or other issues related to misalignments. As illustrated in FIG. 5D, after the axial force 202 has caused the carrier 124 to move in the y-direction, past the lip 504, the circuit board connector 510 is aligned with the corresponding connector 512, and the actuator 128 translates the axial force 202 into a rotational force to create the rotational movement 210 to pull the circuit board 104 in the x-direction toward the rail 110, such that the circuit board connector 510 couples to the corresponding connector 512.

In the illustrated embodiments, the travelers 120, 121 travel from a section of each angled ridge 500, 501 that is closer to the rail 110 to a section further from the rail 110 so as to pull the carrier 124. However, in other embodiments, the travelers 120, 121 travel from a section of each angled ridge 500, 501 that is further from the rail 110 to a section that is closer to the rail 110, so as to push the circuit board 104 to couple to a connector on an opposing interior surface of the slot 108. Further, in some embodiments, angled ridges 500 and 501 may be switched (along with corresponding angled grooves on the travelers) such that the travelers would travel along counter-threads of the threaded rod 126 from a section of each angled ridge that is closer to the rail 110 to a section further from the rail 110, so as to pull the carrier in the x-direction toward the rail. In yet another embodiment, the angled ridges are parallel, such that the travelers do not need to be counter-threaded, and can travel in the same direction from a section of each angled ridge closer to or further from the rail 110 to a section of each angled ridge further from or closer to the rail 110, so as to pull or push the carrier 124, respectively. Some embodiments comprise a single ridge and a single traveler per orthogonal coupling mechanism to pull or push the carrier accordingly. Finally, some embodiments comprise multiples of one or more components of the orthogonal coupling mechanism 106, for example, on the same wall of the slot 108, on opposing walls of the slot, a combination of these, and the like.

While FIGS. 5A-5D are described with reference to insertion, a force in the opposite direction of the axial force 202 (such that the actuator 128 would be pulled instead of pushed) would result in the reverse of the operation depicted in FIGS. 5A-5D, and therefore extraction of the circuit board 104 from the slot 108. That is, as a pulling force is applied to the actuator 128, the lip 504 prevents the carrier 124 from moving in the opposite y-direction, while allowing the actuator 128 to travel along its corresponding thread of the threaded rod 126, translating the pulling force into a rotational movement in the opposite direction of rotational movement 210, and causing the travelers 120, 121 to travel toward each other. In the context of the server 100, the corresponding connectors 510, 512 would be decoupled as the circuit board 104 is moved in the opposite x-direction away from the corresponding connector 512. The lip 504 continues preventing the carrier 200 from moving in the opposite y-direction until the circuit board 104 is fully disengaged with the corresponding connector 512. When the circuit board 104 is clear of the corresponding connector 512, the lip 504 no longer prevents the carrier 124 from moving in the opposite y-direction. In at least one embodiment, one or both of the carrier 124 and the lip 504 comprise at least one rounded corner. For example, in at least one embodiment, a rounded corner of the carrier 124 meets a rounded corner of the lip 504 when the circuit board 104 is clear of the corresponding connector 512, such that the carrier 124 begins moving in the opposite y-direction, sliding along the edge of the rounded corner of the lip 504. When the travelers 120, 121 have reached their first positions 207, 208, or the actuator 128 has no further to travel along its thread away from the proximal end 204 of the threaded rod 126, the actuator 128 will cease to translate the pulling force into the opposite rotational movement, but the pulling force will continue pulling the threaded rod assembly 200 in the opposite y-direction, and in the context of the server 100, remove the circuit board 104 from the slot 108 of the server chassis 102.

Figure 6A:
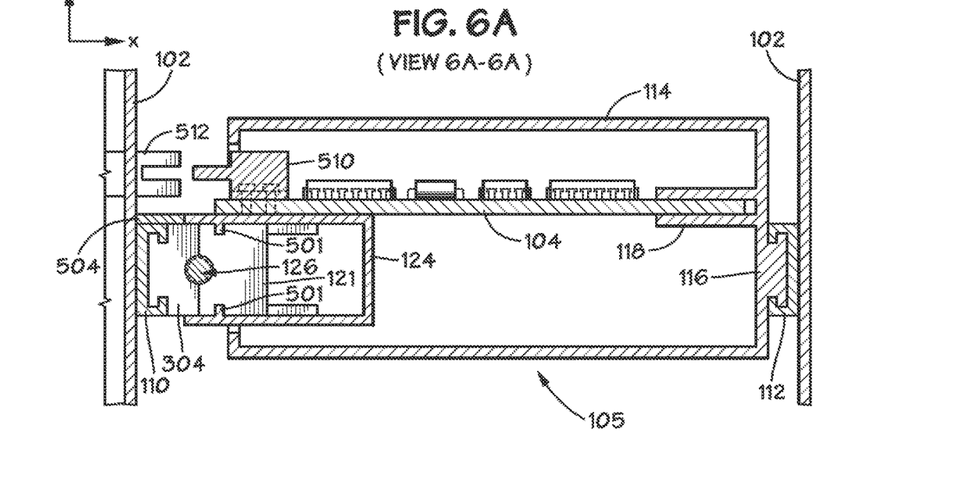
FIGS. 6A and 6B are cross-section views of the orthogonal coupling mechanism, the sled, and the server chassis of FIG. 1 in accordance with some embodiments.
Figure 6B:
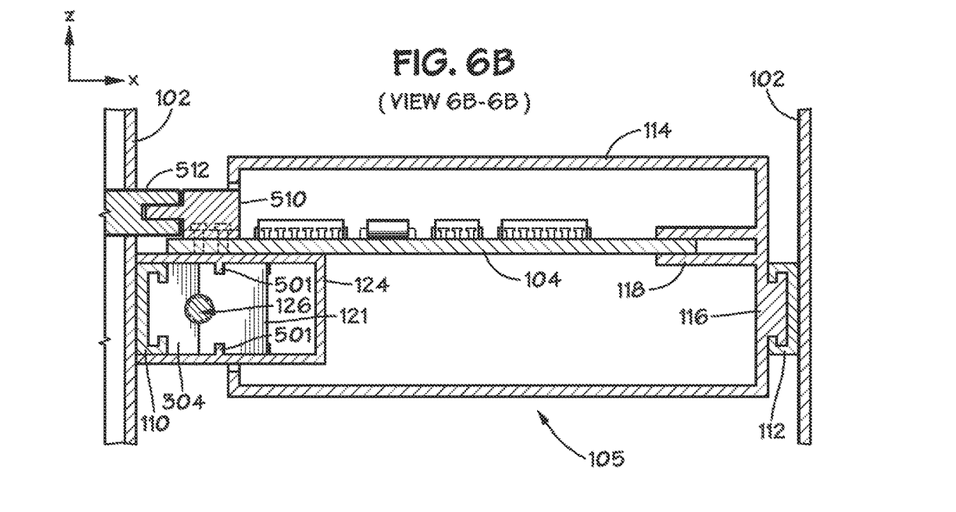

FIGS. 6A and 6B are cross-section views of the orthogonal coupling mechanism 106, the sled 105, and the server chassis 102 of FIG. 1 along cutline 6A-6A of FIG. 5C and cutline 6B-6B of FIG. 5D, respectively, illustrating the operation of the orthogonal coupling mechanism 106 to move the circuit board 104 of the sled 105 in a direction (x-direction) orthogonal to the direction of insertion (y-direction) to couple the circuit board connector 510 to the corresponding connector 512 in accordance with some embodiments. As depicted, the sled 105 comprises the circuit board 104 and the enclosure 114 engaged such that the guide 118 of the enclosure 114 supports the circuit board 104, while allowing the circuit board 104 to move in the x-direction and the y-direction. In some embodiments, the guide 118 allows the circuit board 104 to move in the x-direction without allowing the circuit board 104 to move in the y-direction. The circuit board 104 comprises a plurality of integrated circuit (IC) packages mounted at a surface thereof, as well as the circuit board connector 510 is coupled to the circuit board 104, such that the circuit board connector 510 must be coupled to the corresponding connector 512 in a direction (x-direction) orthogonal to the direction of insertion of the circuit board 104 into the slot 108 of the chassis 102. The circuit board connector 510 may be, for example, a card edge connector, a connector mounted at a surface of the circuit board 104, and the like. Further, in some embodiments, the circuit board 104 may comprise multiple circuit board connectors.

FIG. 6A illustrates the components while the lip 504 of the rail 110 is preventing the carrier 124 from moving in the x-direction closer to the rail 110. In this position, the traveler 121 is positioned at a section of the angled ridge 501 of the carrier 124 that is closer to the rail 110, and the connectors 510, 512 are separated in the x-direction by a distance equal to the height of the lip 504 (in the x-direction). Further, the connectors 510, 512 are separated in the y-direction, such that moving the carrier 124, and therefore the circuit board connector 510 in the x-direction to attempt a coupling would result in a misalignment, potentially damaging both connectors 510, 512.

FIG. 6B illustrates the components after the carrier 124 has moved in the x-direction to pass the lip 504 of the rail 110 and align the circuit board connector 510 with the corresponding connector 512. Since the lip 504 is no longer preventing the carrier 124 from moving in the x-direction, the actuator translates the axial force into a rotational movement, causing the traveler 121 to slide along the angled ridge 501 from a section closer to the rail 110 to a section further from the rail 110, pulling the carrier 124 in the x-direction toward the rail and coupling the circuit board connector 510 to the corresponding connector 512. As illustrated in FIG. 6B, the carrier 124, and therefore the circuit board 104 and the circuit board connector 510 have moved in the x-direction toward the rail 110 relative to their positions in FIG. 6A, while the rail 110, the rod 126, the traveler 121 and the enclosure 114 have not moved in the x-direction relative to their positions in FIG. 6A.

Figure 7:
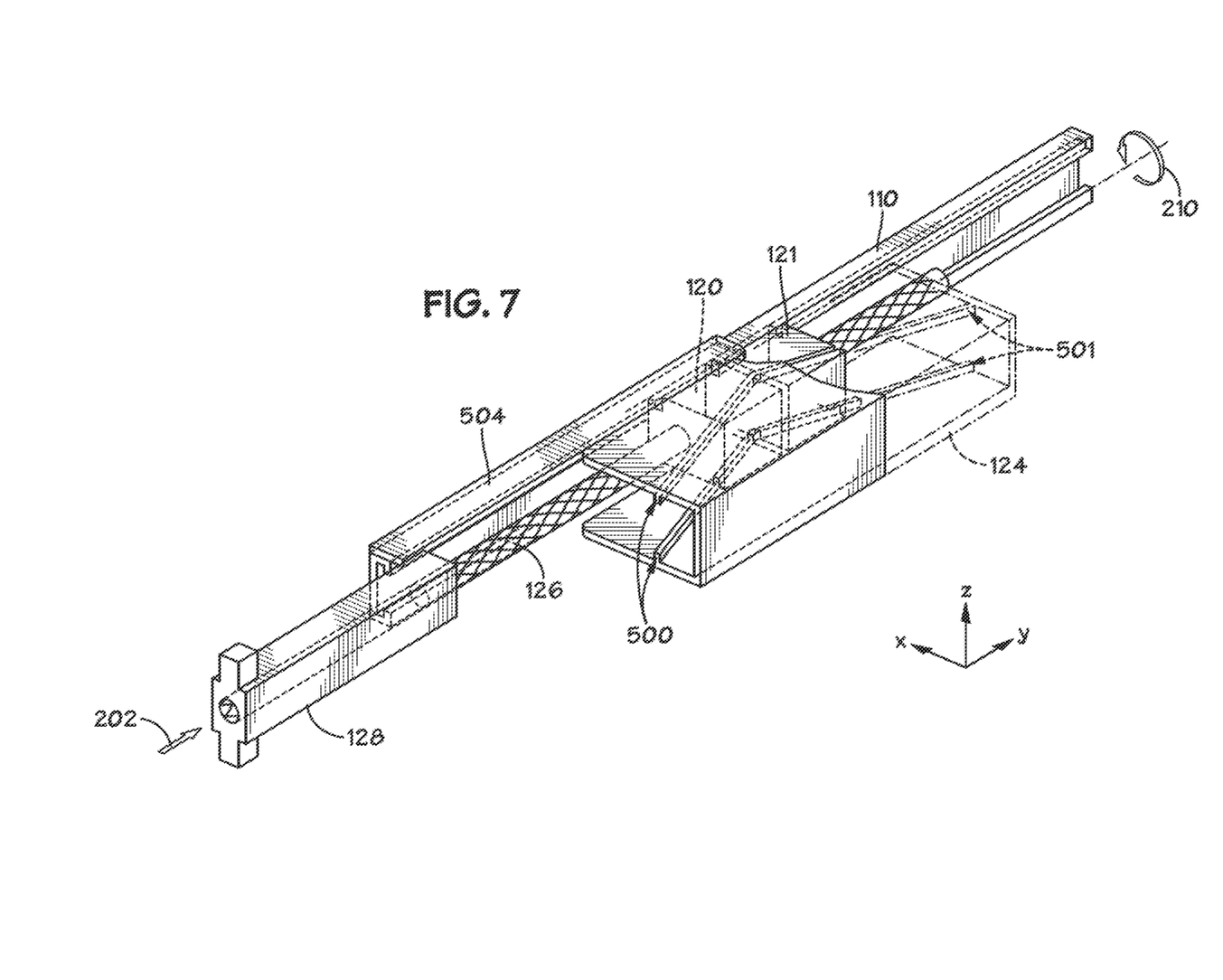
FIG. 7 is a perspective view of the orthogonal coupling mechanism of FIG. 1 in a partially inserted position in accordance with some embodiments.

FIG. 7 is a perspective view of the orthogonal coupling mechanism 106 of FIG. 1 in a partially inserted position such that the lip 504 of the rail 110 prevents the carrier 124 from moving the circuit board 104 in the x-direction orthogonal to the direction of insertion (y-direction) in accordance with some embodiments. As described above with reference to FIGS. 1-6B, the orthogonal coupling mechanism 106 comprises the rod 126, the travelers 120, 121, the carrier 124, the actuator 128, and the rail 110. The carrier 124 comprises angled ridges 500, 501 that couple to the travelers 120, 121 and allow the carrier 124 to move in the x-direction in response to coordinated movement of the travelers 120, 121 in opposite directions along the threaded rod 126. The travelers 120, 121 are further coupled to the rail 110 such that they can slide along the length of the rail 110 in the y-direction. The rail 110 comprises the lip 504 along a section of the rail 110 to prevent the carrier 124 from moving in the x-direction toward the rail 110 until the carrier 124 has passed the lip 504. By preventing the carrier 124 from moving in the x-direction toward the rail, the lip 504 also prevents the travelers 120, 121 from traveling along their counter-threads. As long as the lip 504 prevents the movement of the travelers 120, 121, the axial force 202 on the actuator 128 will result in movement of the threaded rod 126, the travelers 120, 121, the carrier 124, and the actuator 128 as a single unit, in the y-direction.

Once the carrier 124 is past the lip 504, the counterforces created by the travelers 120, 121 are diminished, and the actuator 128 translates the axial force 202 into the rotational movement 210 about the axis of the threaded rod 126. As the actuator 128 travels along its corresponding thread of the threaded rod 126, it causes the threaded rod to twist, causing the travelers 120, 121 to travel along their counter-threads away from each other. As the travelers 120, 121 travel in opposite directions, they slide along their respective angled ridges 500, 501 from a section closer to the rail 110 to a section further from the rail 110, pulling the carrier 124 in the x-direction, toward the rail 110.

As such, the orthogonal coupling mechanism 106 allows a technician or other user to apply a pushing force on the actuator 128 to both insert the circuit board 104 into the slot 108 of the server chassis 102 and pull the circuit board 104 in a direction opposite of the direction of insertion, while also providing a translation of this pushing/pulling force into a pushing/pulling motion in a direction orthogonal to the insertion/removal direction so as to couple the circuit board 104 to the server chassis 102 and decouple the circuit board 104 from the server chassis 102. The techniques and mechanisms described above facilitate insertion and orthogonal coupling (or removal and orthogonal decoupling) without visual cues, while helping to avoid damage to the sled, the server chassis, and the connectors as a result of misalignments, compression forces, and the like. The force multiplier effect of the orthogonal coupling mechanism reduces the significance of the pushing force applied by a technician to insert and couple the sled to the server chassis, and thus reduces the likelihood of damage to the sled or connectors during the installation process. Further, the orthogonal coupling mechanism helps to avoid damage caused by forces on the sled since the technician applies the pushing force to the actuator instead of the sled itself, and the sled is coupled as a result of being pulled by the travelers and the carrier, rather than pushed by the technician.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus comprising:
   a threaded rod;
   a pair of travelers engaging the threaded rod; and
   an actuator disposed on the threaded rod to translate a first axial force along the axis of the threaded rod into rotational movement of the threaded rod about the axis of the threaded rod, the rotational movement to cause the pair of travelers to travel along the axis of the threaded rod so as to move a sliding board into engagement with a first connector in a direction orthogonal to a direction of the first axial force;
   wherein the threaded rod comprises:
      a first thread engaged with a first traveler of the pair of travelers;
      a second thread engaged with a second traveler of the pair of travelers, wherein the first thread and second thread at least partially overlap along the axis of the threaded rod; and
   wherein the first traveler and the second traveler are threaded such that the first and second travelers move in opposite directions in response to the rotational movement of the threaded rod.

2. The apparatus of claim 1, further comprising:
   a second connector disposed at the sliding board, such that the second connector couples to the first connector when the sliding board moves in the direction orthogonal to the direction of the first axial force.

3. The apparatus of claim 1, further comprising:
   a carrier coupled to the sliding board, the carrier comprising a first groove-and-ridge structure;
   wherein each traveler of the pair of travelers comprises a second groove-and-ridge structure to engage the first groove-and-ridge structure of the carrier; and
   wherein the first and second groove-and-ridge structures are angled relative to the axis of the threaded rod.

4. The apparatus of claim 1, wherein the sliding board comprises a circuit board of a server sled.

5. The apparatus of claim 1, wherein the first connector comprises a connector of a server chassis.

6. The apparatus of claim 1, wherein each traveler of the pair of travelers comprises a groove parallel to the axis of the threaded rod, the groove to engage a corresponding edge of a rail for mounting the apparatus to a chassis.

7. The apparatus of claim 1, wherein each traveler of the pair of travelers comprises two portions fastened together around the threaded rod.

8. An apparatus comprising:
   a threaded rod;
   a first traveler engaging the threaded rod;
   a carrier coupled to the first traveler, the carrier comprising a first angled groove-and-ridge structure such that the first angled groove-and-ridge structure is slanted at a non-zero angle relative to the axis of the threaded rod and includes a groove having one end closer to the threaded rod than an opposing end of the groove;
   a sliding board coupled to the carrier; and
   an actuator disposed on the threaded rod to translate an axial force along the axis of the threaded rod into rotational movement about the axis of the threaded rod, such that the first traveler travels along the axis of the threaded rod from an end of the first angled groove-and-ridge structure of the carrier that is proximal to the actuator toward an end of the first angled groove-and-ridge structure of the carrier that is distal to the actuator so as to move a first connector of the sliding board into engagement with a second connector.

9. The apparatus of claim 8, wherein the sliding board comprises a circuit board.

10. The apparatus of claim 8, further comprising:
    a second traveler engaged with the threaded rod; and
    wherein the carrier further comprises a second angled groove-and-ridge structure, such that the second traveler travels along the axis of the threaded rod from an end of the second angled groove-and-ridge structure of the carrier that is proximal to the actuator toward an end of the second angled groove-and-ridge structure of the carrier that is distal to the actuator.

11. The apparatus of claim 10, wherein the rotational movement of the threaded rod is to cause the first traveler and the second traveler to travel along the threaded rod in opposite directions.

12. The apparatus of claim 8, wherein the actuator travels along the threaded rod a greater distance than the first traveler travels along the threaded rod.

13. The apparatus of claim 8, further comprising:
    a first rail coupled to a server chassis to guide the first traveler and the carrier.

14. The apparatus of claim 13, wherein the first rail further comprises:
    a lip extending along a section of a length of the first rail that is less than the total length of the first rail, the lip to prevent the carrier from moving toward the first rail and the actuator from translating the axial force into the rotational movement while the first traveler is in contact with the lip.

15. The apparatus of claim 13, further comprising:
    a second rail coupled to the server chassis, wherein the first rail and the second rail are coupled to opposing interior surfaces of the server chassis.

16. The apparatus of claim 8, further comprising:
    a stopper to prevent movement in a direction of insertion parallel to the axial force when the sliding board is aligned with the first connector while allowing the actuator to translate the axial force into the rotational movement.

17. An apparatus comprising:
    a server chassis comprising a plurality of first connectors; and
    a set of one or more server sleds, each server sled comprising:
       a sliding board comprising a second connector compatible with the first connector;
       a carrier coupled to the sliding board;
       a pair of travelers coupled to the carrier;
       a threaded rod comprising an axis along its length, wherein the pair of travelers is disposed on the threaded rod; and
       an actuator disposed on the threaded rod to translate a first axial force along the axis of the threaded rod into a first rotational movement about the axis of the threaded rod, the first rotational movement to cause the pair of travelers to move along the axis of the threaded rod to move the sliding board in a direction orthogonal to the axis of the threaded rod and couple the first and second connectors; and wherein the threaded rod comprises:
- a first thread engaged with a first traveler of the pair of travelers;
- a second thread engaged with a second traveler of the pair of travelers, wherein the first thread and second thread at least partially overlap along the axis of the threaded rod; and wherein the first traveler and the second traveler are threaded such that the first and second travelers move in opposite directions in response to the first rotational movement of the threaded rod.

18. The apparatus of claim 17, wherein:
the server chassis further comprises a rail corresponding to each of the set of one or more server sleds; and
the first traveler further comprises one or more grooves parallel to the axis of the threaded rod, the one or more grooves to engage corresponding edges of the rail.

19. The apparatus of claim 17, wherein the actuator is to translate a second axial force along the axis of the threaded rod into a second rotational movement about the axis of the threaded rod, the second rotational movement to cause the pair of travelers to move along the axis of the threaded rod to move the sliding board in a direction orthogonal to the axis of the threaded rod and decouple the first and second connectors, wherein the second axial force is in the opposite direction of the first axial force, and the second rotational movement is in the opposite direction of the first rotational movement.

20. The apparatus of claim 17, wherein:
the carrier includes a first groove-and-ridge structure;
the first traveler includes a second groove-and-ridge structure to engage the first groove-and-ridge structure of the carrier; and
wherein the first and second groove-and-ridge structures are angled relative to the axis of the threaded rod.

21. The apparatus of claim 17, wherein the first traveler comprises two portions fastened together around the threaded rod.

22. The apparatus of claim 8, wherein the first traveler comprises two portions fastened together around the threaded rod.

* * * * *